US008400236B2

(12) United States Patent
Mori et al.

(10) Patent No.: US 8,400,236 B2
(45) Date of Patent: Mar. 19, 2013

(54) ELECTRONIC COMPONENT

(75) Inventors: Takahiro Mori, Nagaokakyo (JP); Hiroshi Masuda, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/232,563

(22) Filed: Sep. 14, 2011

(65) Prior Publication Data

US 2012/0001703 A1 Jan. 5, 2012

Related U.S. Application Data

(63) Continuation of application No. PCT/JP2010/051495, filed on Feb. 3, 2010.

(30) Foreign Application Priority Data

Mar. 18, 2009 (JP) ................................. 2009-066542

(51) Int. Cl.
*H03H 7/01* (2006.01)

(52) U.S. Cl. ....................................................... 333/185

(58) Field of Classification Search .......... 333/165–167, 333/175, 176, 185, 204, 205, 219, 235
See application file for complete search history.

(56) References Cited

U.S. PATENT DOCUMENTS

| | | | | |
|---|---|---|---|---|
| 5,157,576 | A * | 10/1992 | Takaya et al. | 361/321.2 |
| 5,382,925 | A | 1/1995 | Hayashi et al. | |
| 6,008,151 | A * | 12/1999 | Sasaki et al. | 501/17 |
| 6,366,564 | B1 | 4/2002 | Hiraka et al. | |
| 6,822,534 | B2 * | 11/2004 | Uriu et al. | 333/185 |
| 6,853,268 | B2 * | 2/2005 | Harada | 333/185 |
| 7,418,251 | B2 * | 8/2008 | Liu | 455/333 |
| 2011/0245644 | A1 * | 10/2011 | Stevenson et al. | 600/372 |

FOREIGN PATENT DOCUMENTS

| | | | |
|---|---|---|---|
| JP | 06-163321 | A | 6/1994 |
| JP | 11-031905 | A | 2/1999 |
| JP | 11-330888 | A | 11/1999 |
| JP | 2006-222691 | A | 8/2006 |

OTHER PUBLICATIONS

Official Communication issued in International Patent Application No. PCT/JP2010/051495, mailed on Apr. 27, 2010.

* cited by examiner

*Primary Examiner* — Benny Lee
*Assistant Examiner* — Gerald Stevens
(74) *Attorney, Agent, or Firm* — Keating & Bennett, LLP

(57) ABSTRACT

An electronic component includes a laminated body including an insulating material layer made of a first dielectric material and a second insulating material layer made of a second dielectric material having a relative dielectric constant greater than that of the first dielectric material that are laminated to one another. An LC filter is defined by a coil included in the laminated body and a capacitor. The coil includes a coil conductor layer provided on the insulating material layer. The coil conductor layer is provided within a region including the insulating material layer.

7 Claims, 7 Drawing Sheets

ELECTRONIC COMPONENT

BACKGROUND OF THE INVENTION

1. Field of the Invention

The present invention relates to an electronic component and, more specifically, to an electronic component including a resonant circuit.

2. Description of the Related Art

As an existing electronic component, for example, an electronic component described in Japanese Unexamined Patent Application Publication No. 2006-222691 is known. FIG. 7 is an exploded perspective view of a laminated body 212 of the electronic component described in Japanese Unexamined Patent Application Publication No. 2006-222691.

The laminated body 212 includes a lamination of dielectric layers 214 (214*a* to 214*f*), and has a rectangular parallelepiped shape. The laminated body 212 includes coils L11 and L12 and capacitors C11 to C14. The coils L11 and L12 include coil conductor layers 216*a* and 216*b*, respectively. The capacitor C11 includes capacitor conductor layers 218*a* and 218*d*. The capacitor C12 includes capacitor conductor layers 218*b* and 218*c*. The capacitor C13 includes the capacitor conductor layers 218*d* and 218*e*. The capacitor C14 includes the capacitor conductor layers 218*c* and 218*e*. The coils L11 and L12 and the capacitors C11 to C14 described above define, for example, a noise filter.

In the electronic component described in Japanese Unexamined Patent Application Publication No. 2006-222691, the dielectric layer 214*d* includes a first dielectric portion 220 and a second dielectric portion 222. The second dielectric portion 222 has a relative dielectric constant greater than that of the first dielectric portion 220. The capacitors C11 to C14 have high capacitances by forming the second dielectric portion 222 as a capacitive layer. The electronic component described above exhibits good pass characteristics in a frequency passband that is used by mobile phones, wireless LANs, and other devices, and has good attenuation characteristics at frequencies other than the frequency passband. In addition, in the electronic component, the dielectric portion 222 has a high relative dielectric constant, and thus it is easy to obtain high capacitances at the capacitors C11 to C14. Therefore, the size of the electronic component can be reduced while the capacitances of the capacitors C11 to C14 are maintained, and the electronic component described in Japanese Unexamined Patent Application Publication No. 2006-222691 can be reduced in size.

Meanwhile, for electronic components including resonant circuits, there is a demand to further reduce the size.

SUMMARY OF THE INVENTION

To overcome the problems described above, preferred embodiments of the present invention provide an electronic component including a resonant circuit that has a reduced size.

An electronic component according to a preferred embodiment of the present invention preferably includes a laminated body including a lamination of a first insulating material layer made of a first dielectric material and a second insulating material layer made of a second dielectric material having a relative dielectric constant greater than that of the first dielectric material, and a first coil included in the laminated body. The first coil includes a coil conductor layer. The coil conductor layer is preferably provided within a first region composed of the second insulating material layer.

According to various preferred embodiments of the present invention, the size of an electronic component including a resonant circuit can be significantly reduced.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, electronic components according to preferred embodiments of the present invention will be described with reference to the drawings.

Figure 1:
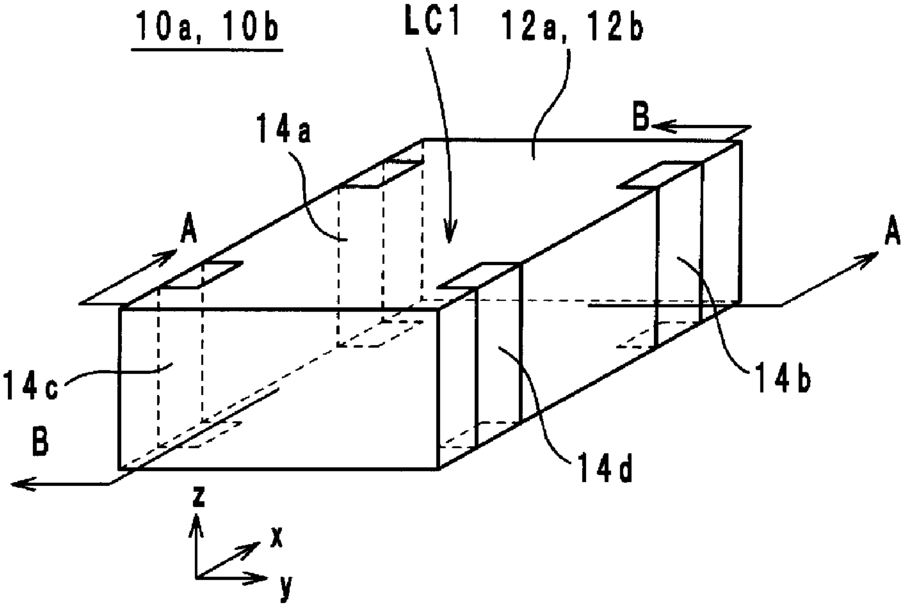
FIG. 1 is an external perspective view of an electronic component according to a preferred embodiment of the present invention.
Figure 2B:
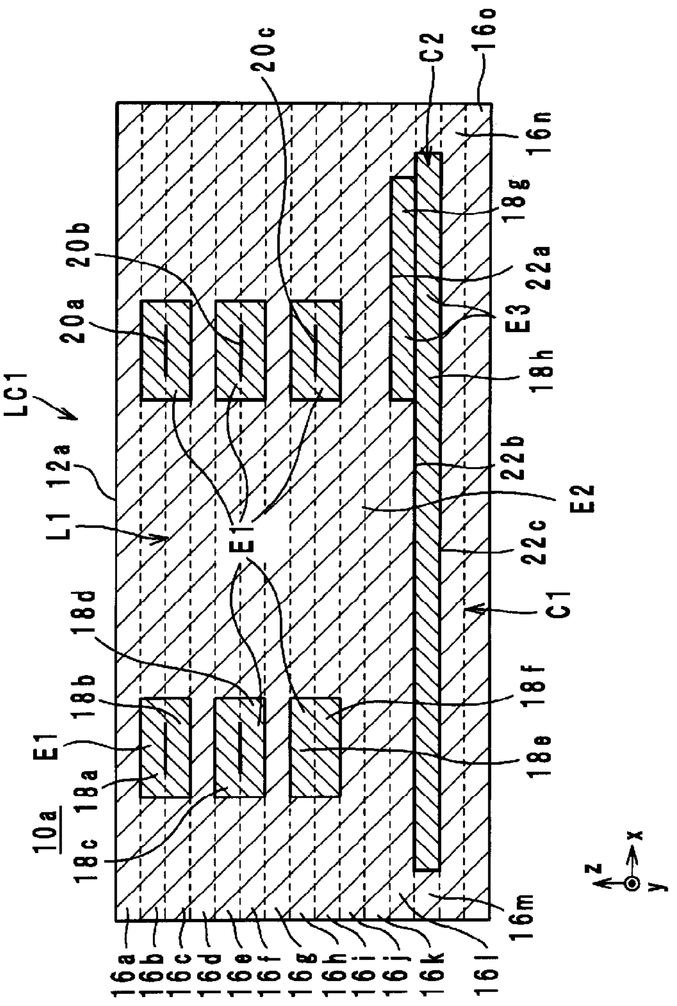
FIGS. 2A and 2B are cross-sectional views of the electronic component shown in FIG. 1 taken along lines A-A and B-B.
Figure 2A:
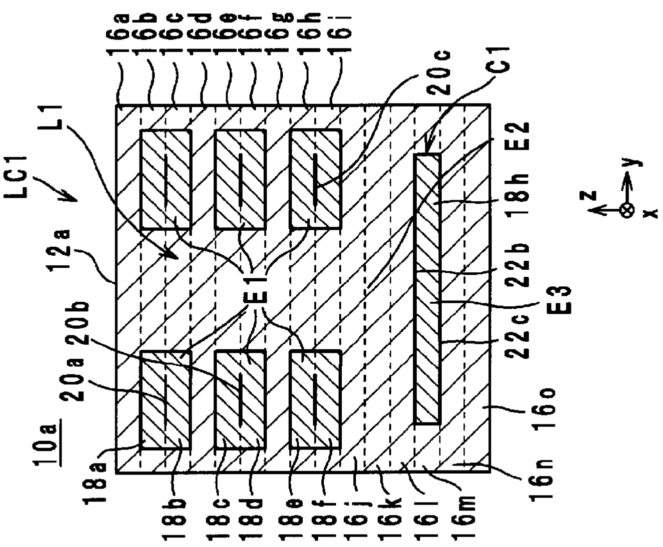
Figure 3:
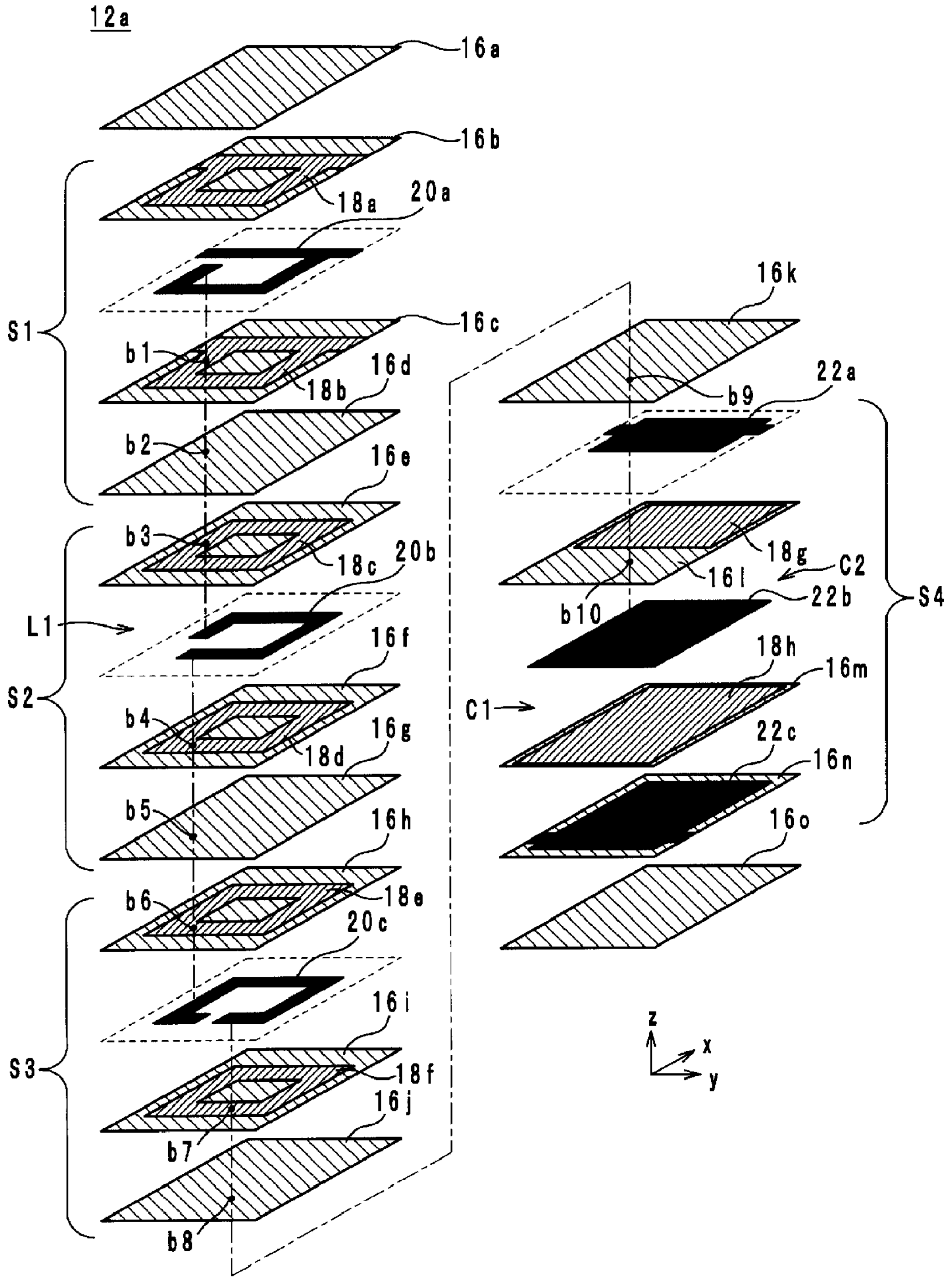
FIG. 3 is an exploded perspective view of a laminated body of the electronic component shown in FIG. 1.
Figure 4:
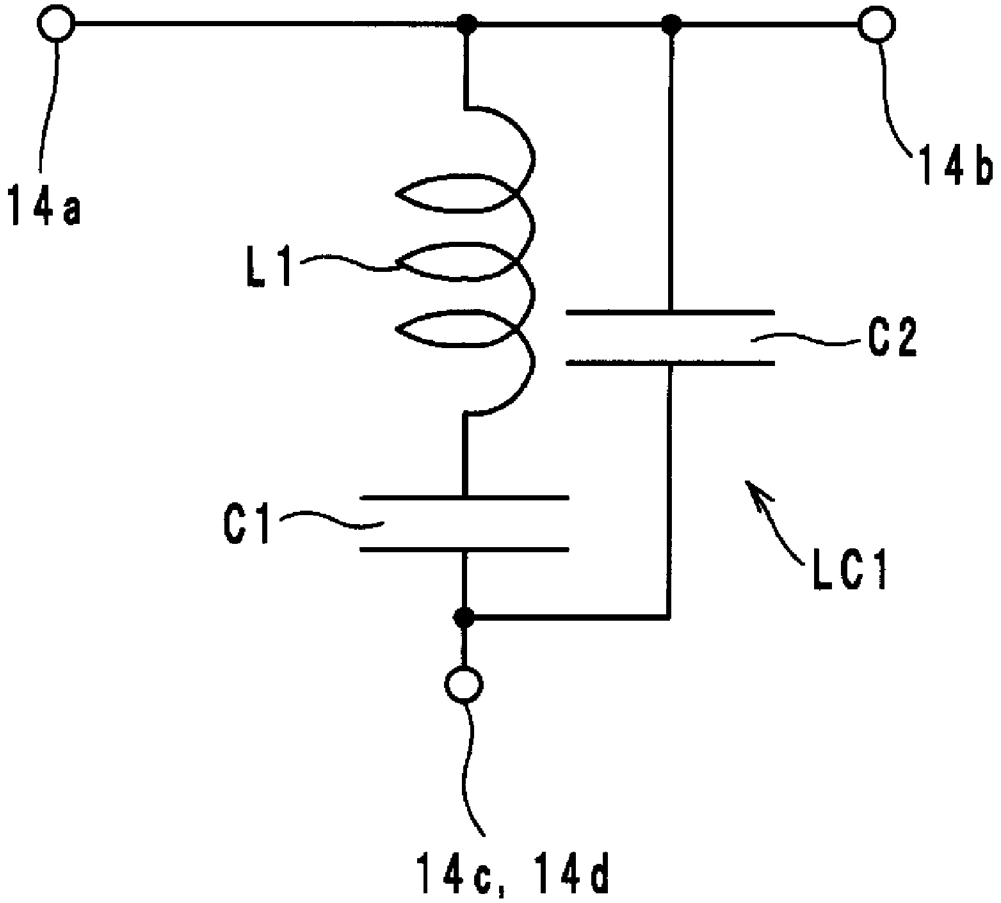
FIG. 4 is an equivalent circuit diagram of the electronic component shown in FIG. 1.

Hereinafter, the structure of an electronic component according to a preferred embodiment of the present invention will be described with reference to the drawings. FIG. 1 is an external perspective view of an electronic component 10*a* or 10*b* according to the preferred embodiment of the present invention. FIG. 2A is a cross-sectional view of the electronic component 10*a* taken along line A-A. FIG. 2B is a cross-sectional view of the electronic component 10*a* taken along line B-B. FIG. 3 is an exploded perspective view of a laminated body 12*a* of the electronic component 10*a*. FIG. 4 is an equivalent circuit diagram of the electronic component 10*a*. In FIGS. 1, 2A, and 2B, a z-axis direction indicates a lamination direction. In addition, an x-axis direction indicates a direction along long sides of the electronic component 10*a*, and a y-axis direction indicates a direction along short sides of the electronic component 10*a*. Further, positive directions and negative directions of the x-axis direction, the y-axis direction, and the z-axis direction are with respect to the center of the laminated body 12*a*.

The electronic component 10*a* is preferably used, for example, as a filter that allows high-frequency signals in the 2.4 GHz band for wireless LANs to pass therethrough and removes signals in the other frequency bands. As shown in FIG. 1, the electronic component 10*a* includes the laminated body 12*a*, external electrodes 14 (14*a* to 14*d*), and an LC filter LC1. As shown in FIGS. 2A, 2B, and 3, the laminated body 12*a* includes a lamination of insulating material layers 16 (16*a* to 16*o*) and 18 (18*a* to 18*h*) preferably made of a ceramic dielectric material, and preferably has a rectangular or substantially rectangular parallelepiped shape.

As shown in FIG. 1, the external electrode 14*a* is provided on a side surface on the negative direction side of the y-axis direction and defines an input terminal. The external electrode 14b is provided on a side surface on the positive direction side of the y-axis direction and defines an output terminal. The external electrode 14c is provided on the side surface on the negative direction side of the y-axis direction and defines a ground terminal. The external electrode 14c is provided on the negative direction side of the x-axis direction with respect to the external electrode 14a. The external electrode 14d is provided on the side surface on the positive direction side of the y-axis direction and defines a ground terminal. The external electrode 14d is provided on the negative direction side of the x-axis direction with respect to the external electrode 14b.

The insulating material layers 16 are preferably made of, for example, a first dielectric material, e.g., a relative dielectric constant of about 5, such as a ceramic dielectric material. The insulating material layers 18 are preferably made of, for example, a second dielectric material having a relative dielectric constant, e.g., a relative dielectric constant of about 50, greater than that of the first dielectric material of the insulating material layers 16.

The LC filter LC1 is included in the laminated body 12a, and is preferably a resonant circuit including a coil L1, capacitors C1 and C2, and via hole conductors b7 to b10 as shown in FIGS. 2A, 2B, and 3. The coil L1 preferably includes coil conductor layers 20a to 20c and via hole conductors b1 to b6. The capacitor C1 includes capacitor conductor layers 22 (22b and 22c). The capacitor C2 preferably includes the capacitor conductor layers 22a, 22b, and 22c. The via hole conductors b7 to b10 connect the coil L1 to the capacitor C1.

Hereinafter, the insulating material layers 16 and 18, the coil conductor layers 20, the capacitor conductor layers 22, and the via hole conductors b1 to b10 will be described in detail with reference to FIGS. 2A, 2B, and 3.

The insulating material layer 16a is preferably a rectangular or substantially rectangular layer made of the first dielectric material and is provided at the most positive direction side of the z-axis direction.

The coil conductor layer 20a preferably includes a straight portion that connects both long sides in the y-axis direction and a coil portion that branches from the straight portion. The straight portion extends to both long sides, and thus, the coil conductor layer 20a is connected to the external electrodes 14a and 14b. In addition, as shown in FIG. 3, the coil portion preferably turns clockwise from a portion at which the coil portion is connected to the straight portion, when viewed from the z-axis direction in a planar view.

The insulating material layer 16d is preferably a rectangular or substantially rectangular layer. The insulating material layer 18b is provided on the insulating material layer 16d. The insulating material layer 18b preferably has a substantially "O" shape along the coil conductor layer 20a and has a width greater than the line width of the coil conductor layer 20a, when viewed from the z-axis direction in a planar view. In addition, the insulating material layer 16c is provided on a portion of the insulating material layer 16d at which the insulating material layer 18b is not provided. The coil conductor layer 20a is provided on the insulating material layer 18b. Thus, the coil conductor layer 20a fits into the insulating material layer 18b without protruding therefrom to the insulating material layer 16c, when viewed from the z-axis direction in a planar view.

The insulating material layer 18a is provided on the insulating material layer 18b and the coil conductor layer 20a. The insulating material layer 18a preferably has a substantially "O" shape along the coil conductor layer 20a and has a width greater than the line width of the coil conductor layer 20a, when viewed from the z-axis direction in a planar view. In addition, the insulating material layer 16b is provided on the insulating material layer 16c. It should be noted that the insulating material layer 18a and the insulating material layer 18b preferably have the same or substantially the same shape, and the insulating material layer 16b and the insulating material layer 16c preferably have the same or substantially the same shape. Thus, the coil conductor layer 20a fits into the insulating material layer 18a without protruding therefrom to the insulating material layer 16b, when viewed from the z-axis direction in a planar view.

With the insulating material layers 16b to 16d, 18a, and 18b and the coil conductor layer 20a described above being laminated, the coil conductor layer 20a is preferably surrounded by the insulating material layers 18a and 18b as shown in FIG. 2. In other words, the coil conductor layer 20a is preferably provided within a region E1 made of the insulating material layers 18a and 18b (the second dielectric material). In addition, preferably, the insulating material layers 18a and 18b each have a shape along the coil conductor layer 20a, and thus the region E1 also has a shape along the coil conductor layer 20a.

The coil conductor layer 20b preferably includes a coil portion having a shape in which a rectangular or substantially rectangular line conductor is partially cut. The insulating material layer 16g is a rectangular or substantially rectangular layer. The insulating material layer 18d is provided on the insulating material layer 16g. The insulating material layer 18d preferably has a substantially "O" shape along the coil conductor layer 20b and has a width greater than the line width of the coil conductor layer 20b, when viewed from the z-axis direction in a planar view. In addition, the insulating material layer 16f is preferably provided on a portion of the insulating material layer 16g at which the insulating material layer 18d is not provided. The coil conductor layer 20b is preferably provided on the insulating material layer 18d. Thus, the coil conductor layer 20b fits into the insulating material layer 18d without protruding therefrom to the insulating material layer 16f, when viewed from the z-axis direction in a planar view.

The insulating material layer 18c is provided on the insulating material layer 18d and the coil conductor layer 20b. The insulating material layer 18c preferably has a substantially "O" shape along the coil conductor layer 20b and has a width greater than the line width of the coil conductor layer 20b, when viewed from the z-axis direction in a planar view. In addition, the insulating material layer 16e is provided on the insulating material layer 16f. It should be noted that the insulating material layer 18c and the insulating material layer 18d preferably have the same or substantially the same shape, and the insulating material layer 16e and the insulating material layer 16f preferably have the same or substantially the same shape. Thus, the coil conductor layer 20b fits into the insulating material layer 18c without protruding therefrom to the insulating material layer 16e, when viewed from the z-axis direction in a planar view.

With the insulating material layers 16e to 16g, 18c, and 18d and the coil conductor layer 20b described above being laminated, the coil conductor layer 20b is surrounded by the insulating material layers 18c and 18d as shown in FIG. 2. In other words, the coil conductor layer 20b is provided within a region E1 including the insulating material layers 18c and 18d (the second dielectric material). In addition, preferably, the insulating material layers 18c and 18d each have a shape along the coil conductor layer 20b, and thus, the region E1 also has a shape along the coil conductor layer 20b.

The coil conductor layer 20*c* preferably includes a coil portion having a shape in which a rectangular or substantially rectangular line conductor is partially cut. The insulating material layer 16*j* is a rectangular or substantially rectangular layer. The insulating material layer 18*f* is provided on the insulating material layer 16*j*. The insulating material layer 18*f* preferably has a substantially "O" shape along the coil conductor layer 20*c* and has a width greater than the line width of the coil conductor layer 20*c*, when viewed from the z-axis direction in a planar view. In addition, the insulating material layer 16*i* is provided on a portion of the insulating material layer 16*j* at which the insulating material layer 18*f* is not provided. The coil conductor layer 20*c* is provided on the insulating material layer 18*f*. Thus, the coil conductor layer 20*c* fits into the insulating material layer 18*f* without protruding therefrom to the insulating material layer 16*i*, when viewed from the z-axis direction in a planar view.

The insulating material layer 18*e* is provided on the insulating material layer 18*f* and the coil conductor layer 20*c*. The insulating material layer 18*e* preferably has a substantially "O" shape along the coil conductor layer 20*c* and has a width greater than the line width of the coil conductor layer 20*c*, when viewed from the z-axis direction in a planar view. In addition, the insulating material layer 16*h* is provided on the insulating material layer 16*i*. It should be noted that the insulating material layer 18*e* and the insulating material layer 18*f* preferably have the same or substantially the same shape, and the insulating material layer 16*h* and the insulating material layer 16*i* preferably have the same or substantially the same shape. Thus, the coil conductor layer 20*c* fits into the insulating material layer 18*e* without protruding therefrom to the insulating material layer 16*h*, when viewed from the z-axis direction in a planar view.

With the insulating material layers 16*h* to 16*j*, 18*e*, and 18*f* and the coil conductor layer 20*c* described above being laminated, the coil conductor layer 20*c* is surrounded by the insulating material layers 18*e* and 18*f* as shown in FIG. 2. In other words, the coil conductor layer 20*c* is provided within a region E1 including the insulating material layers 18*e* and 18*f* (the second dielectric material). In addition, the insulating material layers 18*e* and 18*f* each preferably have a shape along the coil conductor layer 20*c*, and thus, the region E1 also has a shape along the coil conductor layer 20*c*.

The via hole conductors b1 to b3 extend through the insulating material layers 18*b*, 16*d*, and 18*c*, respectively, in the z-axis direction, to connect the coil conductor layers 20*a* and 20*b*. Specifically, the via hole conductor b1 is connected to an end of the coil portion of the coil conductor layer 20*a*. In addition, the via hole conductor b3 is connected to an end of the coil conductor layer 20*b*.

The via hole conductors b4 to b6 extend through the insulating material layers 18*d*, 16*g*, and 18*e*, respectively, in the z-axis direction to connect the coil conductor layers 20*b* and 20*c*. Specifically, the via hole conductor b4 is connected to an end of the coil conductor layer 20*b* to which the via hole conductor b3 is not connected. In addition, the via hole conductor b6 is connected to an end of the coil conductor layer 20*c*.

The insulating material layer 16*k* is a substantially rectangular layer, and is provided on the negative direction side of the z-axis direction with respect to the insulating material layer 16*j*. In addition, the insulating material layer 16*n* is a rectangular or substantially rectangular layer. The capacitor conductor layer 22*c* is a rectangular or substantially rectangular conductor layer provided on the insulating material layer 16*n* so as to cover substantially the entire surface of the insulating material layer 16*n*. However, the capacitor conductor layer 22*c* preferably extends to both long sides of the insulating material layer 16*n* in the y-axis direction, and does not contact the other portion of the outer edge of the insulating material layer 16*n*. Thus, the capacitor conductor layer 22*c* is connected to the external electrodes 14*c* and 14*d*.

The insulating material layer 18*h* is a rectangular or substantially rectangular layer provided on the capacitor conductor layer 22*c*. The insulating material layer 16*m* is preferably disposed around the insulating material layer 18*h*. The capacitor conductor layer 22*b* is a rectangular or substantially rectangular conductor layer provided on the insulating material layer 18*h*. Thus, as shown in FIG. 2, the insulating material layer 18*h* made of the second dielectric material is preferably provided in a region E3 sandwiched between the capacitor conductor layers 22*b* and 22*c*.

The insulating material layer 18*g* preferably has a size that is about half that of the capacitor conductor layer 22*b*, for example, and is provided on the capacitor conductor layer 22*b*. The insulating material layer 16*l* is provided on portions of the capacitor conductor layer 22*b* and the insulating material layer 16*m* at which the insulating material layer 18*g* is not provided.

The capacitor conductor layer 22*a* is a rectangular or substantially rectangular conductor layer preferably having a size that is about half that of the capacitor conductor layer 22*b*, for example, and is provided on the insulating material layer 18*g*. Thus, as shown in FIG. 2, the insulating material layer 18*g* made of the second dielectric material is preferably provided in a region E3 sandwiched between the capacitor conductor layers 22*a* and 22*b*. In addition, the capacitor conductor layer 22*a* preferably extends to both long sides of the insulating material layer 16*l* in the y-axis direction to be connected to the external electrodes 14*a* and 14*d*.

The via hole conductors b7 to b10 extend through the insulating material layers 18*f*, 16*j*, 16*k*, and 16*l*, respectively, in the z-axis direction. The via hole conductors b7 to b10 connect the coil L1 to the capacitor C1. Specifically, the via hole conductor b7 is connected to an end of the coil conductor layer 20*c* to which the via hole conductor b6 is not connected. In addition, the via hole conductor b10 is connected to the capacitor conductor layer 22*b*.

Further, the insulating material layer 16*o* has a rectangular or substantially rectangular shape, and is provided at the most negative direction of the z-axis direction.

It should be noted that as shown in FIG. 2, at least a portion of a region E2 between the coil L1 and the capacitors C1 and C2 preferably includes the insulating material layers 16*j* and 16*k* (the first dielectric material).

The electronic component 10*a* configured as described above defines a filter as shown in FIG. 4. More specifically, the straight portion of the coil conductor layer 20*a* connects the external electrodes 14*a* and 14*b*. Thus, as shown in FIG. 4, the external electrodes 14*a* and 14*b* are connected to each other by a wire.

Further, the coil portion of the coil conductor layer 20*a* preferably branches from the straight portion. Moreover, the coil portion of the coil conductor layer 20*a* and the coil conductor layers 20*b* and 20*c* are connected to each other. Thus, the coil L1 is arranged to branch from the wire that connects the external electrodes 14*a* and 14*b*.

Further, the coil conductor layer 20*c* and the capacitor conductor layer 22*b* are connected to each other by the via hole conductors b7 to b10. Moreover, the capacitor conductor layer 22*c* is connected to the external electrodes 14*c* and 14*d*. Thus, as shown in FIG. 4, the coil L1 and the capacitor C1 are connected in series between the external electrodes 14*c* and 14*d* and the wire that connects the external electrodes 14*a* and 14*b*.

Further, the capacitor conductor layer 22*a* is connected to the external electrodes 14*a* and 14*b*, and the capacitor conductor layer 22*c* is connected to the external electrodes 14*c* and 14*d*. Thus, as shown in FIG. 4, the capacitor C2 is connected between the external electrodes 14*a* and 14*b* and the external electrodes 14*c* and 14*d*. In other words, the capacitor C2 is connected in parallel to the coil L1 and the capacitor C1.

A method of manufacturing the electronic component 10*a* configured as described above will be described with reference to FIGS. 1 and 3. In the following, a case in which one electronic component 10*a* is manufactured will be described, but in reality, a plurality of electronic components 10*a* preferably are simultaneously manufactured.

First, ceramic green sheets that are to be the insulating material layers 16*a*, 16*d*, 16*g*, 16*j*, 16*k*, 16*n*, and 16*o* are prepared. Next, a paste of the second dielectric material is applied onto the ceramic green sheet that is to be the insulating material layer 16*d* by screen printing to form a ceramic green layer that is to be the insulating material layer 18*b*. A paste of the first dielectric material is applied onto the ceramic green sheet that is to be the insulating material layer 16*d* by screen printing to form a ceramic green layer that is to be the insulating material layer 16*c*.

Next, the via hole conductors b1 and b2 are formed in the ceramic green sheets that are to be the insulating material layers 16*d* and 18*b*. Specifically, for example, a laser beam is radiated to the ceramic green sheets that are to be the insulating material layers 16*d* and 18*b* to form via holes. Then, the via holes are filled with a conductive paste preferably including Cu or other suitable material, for example, as a principal component.

Next, the conductive paste preferably including Cu or other suitable material, for example, as a principal component is applied onto the ceramic green layer that is to be the insulating material layer 18*b* by screen printing to form the coil conductor layer 20*a*. It should be noted that when forming the coil conductor layer 20*a*, the via holes in the ceramic green sheets that are to be the insulating material layers 16*d* and 18*b* may preferably be filled with the conductive paste.

Next, the paste of the second dielectric material is applied onto the coil conductor layer 20*a* and the ceramic green layer that is to be the insulating material layer 18*b* by screen printing to form a ceramic green layer that is to be the insulating material layer 18*a*. Further, the paste of the first dielectric material is applied onto the ceramic green sheet that is to be the insulating material layer 16*c* by screen printing to form a ceramic green layer that is to be the insulating material layer 16*b*. By these processes, a ceramic green sheet S1 shown in FIG. 3 is produced. In addition, by conducting the same processes, ceramic green sheets S2 and S3 are produced.

Next, the conductive paste preferably including Cu or other suitable material, for example, as a principal component is applied onto the ceramic green sheet that is to be the insulating material layer 16*n* by screen printing to form the capacitor conductor layer 22*c*. Next, the paste of the second dielectric material is applied onto the capacitor conductor layer 22*c* by screen printing to form a ceramic green layer that is to be the insulating material layer 18*h*. Further, the paste of the first dielectric material is applied onto the ceramic green sheet that is to be the insulating material layer 16*n* by screen printing to form a ceramic green layer that is to be the insulating material layer 16*m*.

Next, the conductive paste preferably including Cu or other suitable material, as a principal component is applied onto the ceramic green layer that is to be the insulating material layer 16*m* by screen printing to form the capacitor conductor layer 22*b*. Next, the paste of the second dielectric material is applied onto the capacitor conductor layer 22*b* by screen printing to form a ceramic green layer that is to be the insulating material layer 18*g*.

Next, the paste of the first dielectric material is applied onto the capacitor conductor layer 22*b* and the ceramic green layer that is to be the insulating material layer 16*m* to form a ceramic green layer that is to be the insulating material layer 16*l*. At that time, the via hole conductor b10 is formed in the ceramic green layer that is to be the insulating material layer 16*l*. Specifically, preferably, when forming the ceramic green layer that is to be the insulating material layer 16*l*, a via hole is formed. Then, the via hole is filled with the conductive paste preferably including Cu or other suitable material, for example, as a principal component, by screen printing.

Next, the conductive paste preferably including Cu or other suitable material, for example, as a principal component is applied onto the ceramic green layer that is to be the insulating material layer 18*g* by screen printing to form the capacitor conductor layer 22*a*. It should be noted that when forming the capacitor conductor layer 22*a*, the via hole in the ceramic green layer that is to be the insulating material layer 16*l* may preferably be filled with the conductive paste. By these processes, a ceramic green sheet S4 is produced.

Next, the via hole conductor b9 is formed in the ceramic green sheet that is to be the insulating material layer 16*k*. Specifically, a laser beam is radiated to the ceramic green sheet that is to be the insulating material layer 16*k* to form a via hole. Then, the via hole is filled with the conductive paste preferably including Cu or other suitable material, for example, as a principal component.

The ceramic green sheets formed as described above are laminated to obtain the laminated body 12*a*. Specifically, the ceramic green sheet that is to be the insulating material layer 16*o* is arranged. Next, the ceramic green sheet S4 is laminated on the ceramic green sheet that is to be the insulating material layer 16*o*, and provisional pressure-bonding is performed. Then, the ceramic green sheet that is to be the insulating material layer 16*k*, the ceramic green sheets S3, S2, and S1, and the ceramic green sheet that is to be the insulating material layer 16*a* are also laminated and provisional pressure-bonding is performed in order. By so doing, an unfired laminated body 12*a* is obtained. The unfired laminated body 12*a* is subjected to main pressure-bonding preferably by a hydrostatic press or other suitable method, for example. Further, a de-binder process and firing are conducted on the unfired laminated body 12*a*.

By these processes, a fired laminated body 12*a* is produced. Barrel finishing is conducted on the laminated body 12*a* to perform chamfering. Then, an electrode paste preferably including copper, for example, as a principal component is applied onto the surface of the laminated body 12*a*, for example, by a method such as an immersion method, and is baked to form a copper electrode that is to be the external electrode 14.

Finally, Ni plating/Sn plating is preferably performed on the surface of the copper electrode to form the external electrode 14. Through these processes, the electronic component 10*a* shown in FIG. 1 is produced.

It should be noted that when a plurality of electronic components 10*a* are produced simultaneously, large ceramic green sheets are laminated to produce a mother laminated body. Then, the mother laminated body is cut to obtain laminated bodies.

Figure 7:
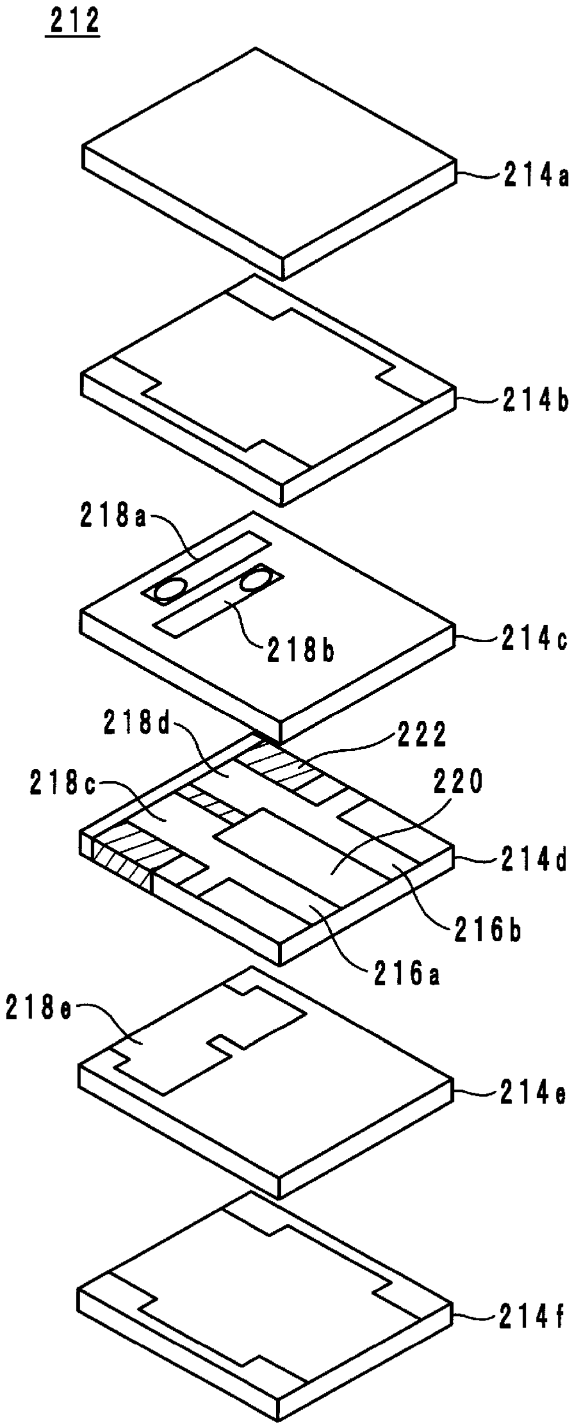
FIG. 7 PRIOR ART
FIG. 7 is an exploded perspective view of a known laminated body of an electronic component.

According to the electronic component 10*a* configured as described above, the size of the electronic component 10*a* including the resonant circuit can be significantly reduced as described below. More specifically, in the known electronic component shown in FIG. 7, the second dielectric portion 222 having a high relative dielectric constant defines the capacitive layer of the capacitors C11 to C14. This makes it easy to obtain high capacitances at the capacitors C11 to C14. Thus, the size of the capacitors C11 to C14 can be reduced, and the overall size of the electronic component shown in FIG. 7 can be reduced.

However, the first dielectric portion 220 having a low relative dielectric constant is provided around the coils L11 and L12. The propagation velocity of a high-frequency signal propagating through the coils L11 and L12 is inversely proportional to the relative dielectric constant. Thus, the propagation velocity of the high-frequency signal propagating through the coils L11 and L12 becomes relatively high. As a result, the wavelength of the high-frequency signal becomes relatively long.

If the wavelength of the high-frequency signal becomes long, it is necessary to increase the line lengths of the coils L11 and L12 when the coils L11 and L12 and the capacitors C11 to C14 define a resonant circuit. As a result, the size of the electronic component shown in is increased.

Therefore, in the electronic component 10*a*, the coil conductor layers 20*a* to 20*c* are provided within the region E1 including the insulating material layers 18 (second dielectric layers). In other words, the coil conductor layers 20*a* to 20*c* are surrounded by the second dielectric layers each having a high relative dielectric constant. Thus, the propagation velocity of a high-frequency signal propagating through the coil conductor layers 20*a* to 20*c* becomes low. Therefore, the wavelength of the high-frequency signal propagating through the coil conductor layers 20*a* to 20*c* becomes short. As a result, when the coil L1 and the capacitor C1 define a resonant circuit, the line length of the coil L1 can be significantly reduced. In other words, the size of the electronic component 10*a* is significantly reduced.

Further, in the electronic component 10*a*, the self-resonant frequency of the coil L1 can preferably be decreased. More specifically, the coil conductor layers 20*a* to 20*c* are surrounded by the second dielectric layers. Thus, a stray capacitance between the coil conductor layers 20*a* to 20*c* becomes high. The self-resonant frequency of the coil L1 is inversely proportional to the square root of the product of the inductance value of the coil L1 and the stray capacitance of the coil L1. Thus, in the electronic component 10*a*, when the stray capacitance between the coil conductor layers 20*a* to 20*c* becomes high, the self-resonant frequency of the coil L1 becomes low.

Further, in the electronic component 10*a*, a stray capacitance between the coil L1 and the capacitors C1 and C2 can be effectively reduced. More specifically, as shown in FIGS. 2A and 2B, at least a portion of the region E2 between the coil L1 and the capacitors C1 and C2 is defined by the insulating material layers 16*j* and 16*k* (the first dielectric material) each having a relative dielectric constant less than that of the first dielectric material. Thus, in the electronic component 10*a*, the stray capacitance between the coil L1 and the capacitors C1 and C2 is effectively reduced. As a result, a reduction of the Q value of the coil L1 is minimized or prevented, and the self-resonant frequency of the electronic component 10 can be effectively increased. As described above, according to the electronic component 10*a*, the usable frequency band of the electronic component 10*a* can be easily adjusted.

Further, in the electronic component 10*a*, as described below, the manufacturing costs are reduced. More specifically, in the method of manufacturing the electronic component 10*a*, screen printing is preferably performed on the ceramic green sheets that are to be the insulating material layers 16*a*, 16*d*, 16*g*, 16*j*, 16*k*, 16*n*, and 16*o*, to form the ceramic green layers that are to be the insulating material layers 16 and 18, the coil conductor layer 20, and the capacitor conductor layer 22. Thus, only one type of ceramic green sheet needs to be prepared. As a result, in the electronic component 10*a*, the manufacturing costs are reduced as compared to an electronic component for which it is necessary to prepare a plurality of types of ceramic green sheets.

Further, the capacitive layers of the capacitors C1 and C2 are defined by the insulating material layers 18 made of the second dielectric material having a high relative dielectric constant. Thus, in the electronic component 10*a*, it is easy to increase the capacitances of the capacitors C1 and C2. As a result, while the capacitances of the capacitors C1 and C2 are maintained, the size of the capacitors C1 and C2 can be reduced. Thus, the size of the electronic component 10*a* can be reduced.

Figure 5B:
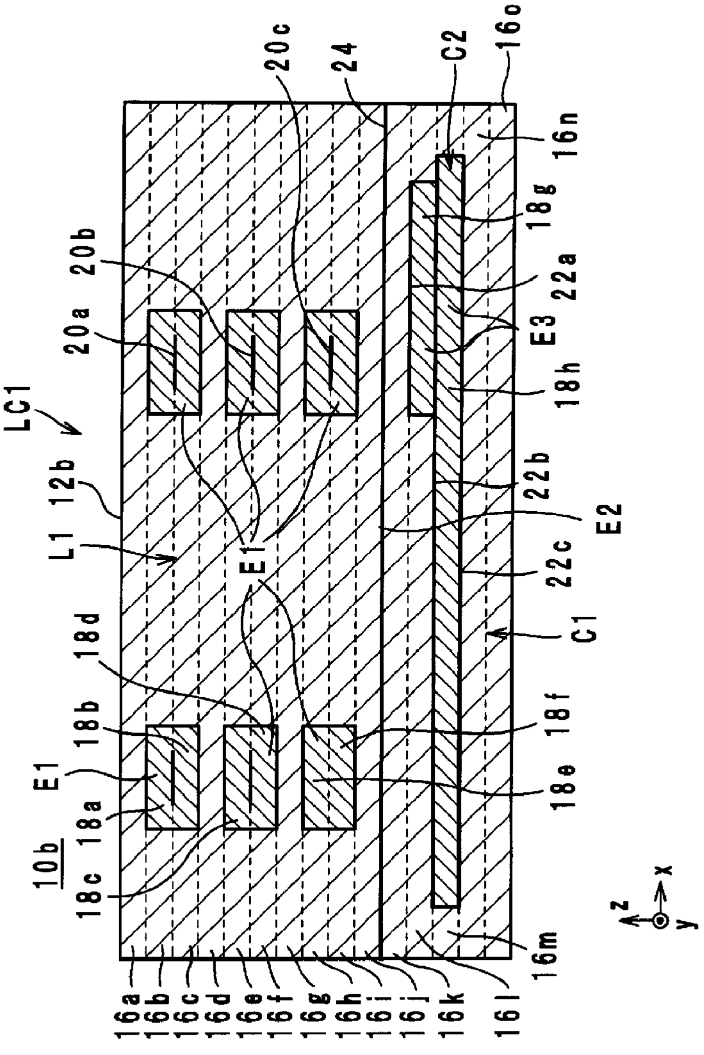
FIGS. 5A and 5B are cross-sectional views of an electronic component according to another preferred embodiment of the present invention.
Figure 5A:
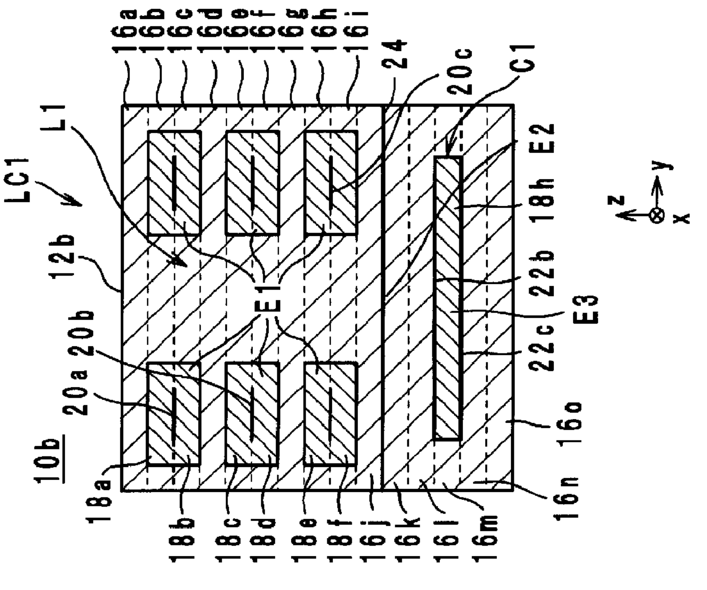

The electronic component according to preferred embodiments of the present invention is not limited to the electronic component 10*a* and may be changed within the scope of the present invention. Hereinafter, an electronic component 10*b* according to another preferred embodiment of the present invention will be described with reference to FIGS. 5A and 5B, which are cross-sectional views of the electronic component 10*b* according to another preferred embodiment of the present invention.

The electronic component 10*b* differs from the electronic component 10*a* in that a ground conductor layer 24 is preferably provided as shown in FIG. 5. The ground conductor layer 24 is preferably a conductor layer provided between the coil L1 and the capacitors C1 and C2 in the z-axis direction, and is connected to the external electrodes 14*c* and 14*d*. Thus, isolation between the coil L1 and the capacitors C1 and C2 is improved. It should be noted that a wire or via hole conductor connected to the external electrodes 14*c* and 14*d* may be provided instead of the ground conductor layer 24.

Next, an electronic component 10*c* according to another preferred embodiment of the present invention will be described with reference to FIG. 6, which is a cross-sectional view of the electronic component 10*c* according to another preferred embodiment.

The electronic component 10*c* differs from the electronic component 10*a* in that an LC filter LC2 is preferably provided. The LC filter LC1 allows high-frequency signals in the 2.4 GHz band to pass therethrough. Meanwhile, the LC filter LC2 has a resonant frequency greater than that of the LC filter LC1, and allows high-frequency signals in the 5 GHz band to pass therethrough. Thus, the LC filter LC1 and the LC filter LC2 define a splitter.

Figure 6:
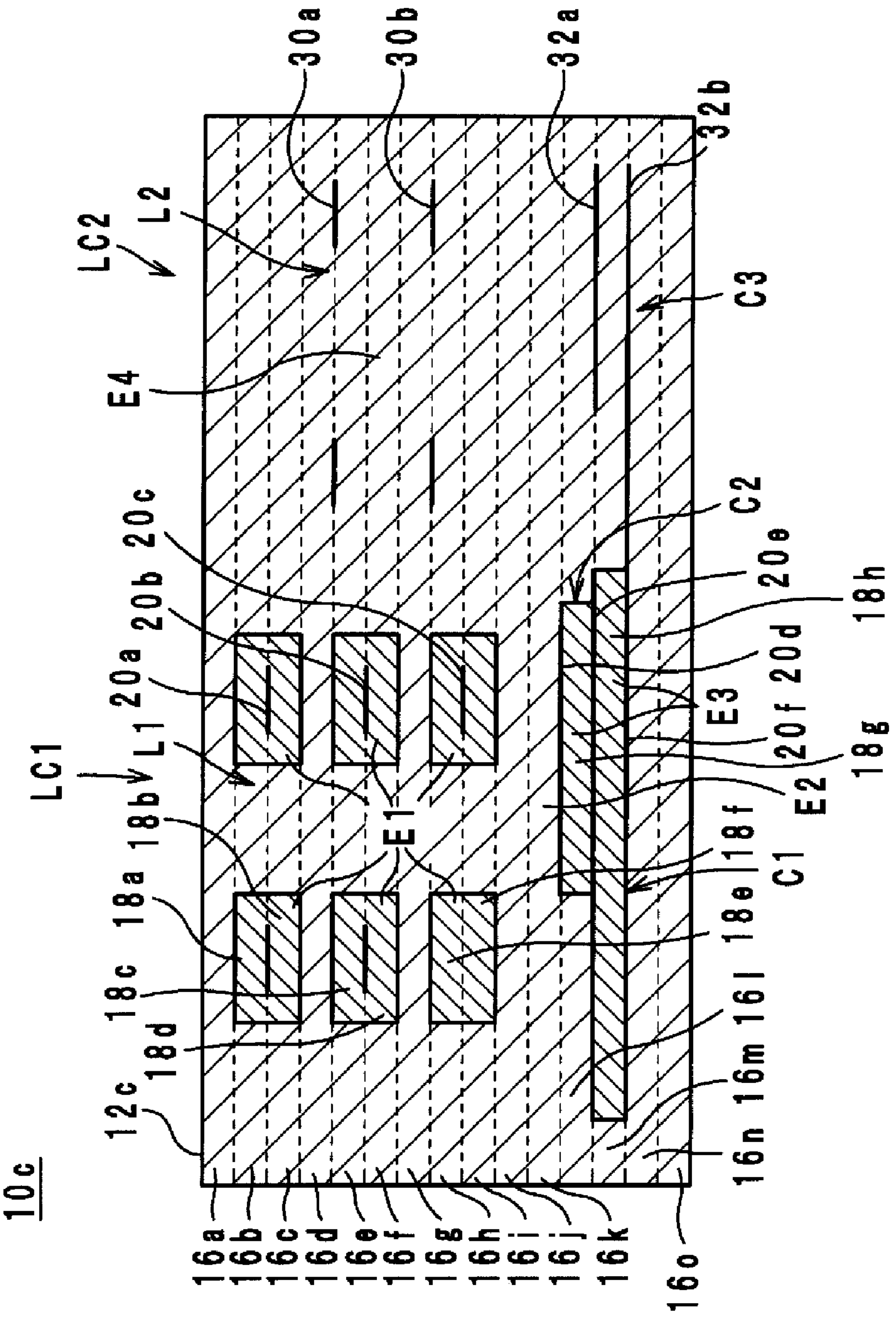
FIG. 6 is a cross-sectional view of an electronic component according to another preferred embodiment of the present invention.

As shown in FIG. 6, the LC filter LC2 preferably includes a coil L2 and a capacitor C3. The coil L2 preferably includes coil conductor layers 30*a* and 30*b* and a via hole conductor that is not shown. In addition, the capacitor C3 preferably includes capacitor conductor layers 32*a* and 32*b*. Further, the coil L2 and the capacitor C3 are connected to each other by a via hole conductor that is not shown.

Here, as described above, the LC filter LC2 preferably has a resonant frequency greater than that of the LC filter LC1. Thus, the self-resonant frequency of the coil L2 of the LC filter LC2 does not need to be decreased to be as low as the self-resonant frequency of the coil L1 of the LC filter LC1. Therefore, the coil conductor layers 30*a* and 30*b* defining the coil L2 are preferably provided within a region E4 including the first dielectric material having a relative dielectric constant less than that of the second dielectric material.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:

a laminated body including a plurality of layers including a first insulating material layer made of a first dielectric material and a second insulating material layer made of a second dielectric material having a relative dielectric constant greater than that of the first dielectric material that are laminated to one another; and a first coil included in the laminated body; wherein the first insulating material layer and the second insulating material layer define a single layer of the plurality of layers;

the first coil includes a coil conductor layer; and the coil conductor layer is provided within a first region of the laminated body including the second insulating material layer such that the coil conductor layer is arranged inside of the second insulating material layer and does not protrude from the second insulating material layer to the first insulating material layer when viewed from a direction in which the plurality of layers of the laminated body are laminated.

2. The electronic component according to claim 1, wherein the first region is arranged along the coil conductor layer.

3. The electronic component according to claim 1, further comprising:

a first capacitor included in the laminated body; wherein the first coil and the first capacitor define a first resonant circuit.

4. The electronic component according to claim 3, wherein at least a portion of a second region between the first coil and the first capacitor includes the first insulating material layer.

5. The electronic component according to claim 3, wherein the first capacitor includes a plurality of capacitor conductor layers; and the second insulating material layer is provided in a third region sandwiched between the plurality of capacitor conductor layers.

6. The electronic component according to claim 3, further comprising a via hole conductor connecting the first coil to the first capacitor.

7. The electronic component according to claim 3, wherein the laminated body further comprises a second resonant circuit including a second coil and a second capacitor and having a resonant frequency greater than that of the first resonant circuit; and the second coil is provided within a fourth region including the first insulating material layer.

* * * * *